(12) United States Patent
Fan et al.

(10) Patent No.: US 6,585,905 B1
(45) Date of Patent: Jul. 1, 2003

(54) LEADLESS PLASTIC CHIP CARRIER WITH PARTIAL ETCH DIE ATTACH PAD

(75) Inventors: Chun Ho Fan, Sham Tseng (HK); Tsui Yee Lin, Kowloon (HK); Kin Yan Tsang, Kwai Fong (HK); Neil McLellan, Hong Kong (HK)

(73) Assignee: ASAT Ltd., New Territories (HK)

( * ) Notice: Subject to any disclaimer, the term of this patent is extended or adjusted under 35 U.S.C. 154(b) by 0 days.

(21) Appl. No.: 10/115,228

(22) Filed: Apr. 3, 2002

Related U.S. Application Data

(63) Continuation-in-part of application No. 09/454,794, filed on Dec. 3, 1999, now Pat. No. 6,294,100, which is a continuation-in-part of application No. 09/288,252, filed on Apr. 8, 1999, now Pat. No. 6,498,099, which is a continuation-in-part of application No. 09/095,803, filed on Jun. 10, 1998, now Pat. No. 6,229,200.

(51) Int. Cl.[7] .............................. B44C 1/22; H01L 21/00
(52) U.S. Cl. ............................ 216/14; 216/20; 257/678; 438/106; 438/745; 438/754
(58) Field of Search ....................... 216/14, 20, 33, 216/37, 52; 438/106, 110, 112, 118, 127, 745, 754; 257/678, 684, 687, 690

(56) References Cited

U.S. PATENT DOCUMENTS

| | | | | |
|---|---|---|---|---|
| 4,530,152 A | * | 7/1985 | Roche et al. | 29/588 |
| 4,685,998 A | * | 8/1987 | Quinn et al. | 216/14 X |
| 5,457,340 A | * | 10/1995 | Templeton et al. | 257/666 |
| 5,710,695 A | * | 1/1998 | Manteghi | 361/813 |
| 5,976,912 A | * | 11/1999 | Fukutomi et al. | 438/110 |
| 6,001,671 A | * | 12/1999 | Fjelstad | 438/112 |

* cited by examiner

Primary Examiner—William A. Powell
(74) Attorney, Agent, or Firm—Keating & Bennett, LLP

(57) ABSTRACT

A leadless plastic chip carrier comprising a die attach pad, a semiconductor die mounted to a portion of the die attach pad and at least one row of contact pads circumscribing the die attach pad. The row of contact pads have a thickness greater than the thickness of the portion of the die attach pad. A plurality of wire bonds connect the die attach pad and the contact pads. An overmold covers the semiconductor die and all except one surface of the at least one row of contact pads and the die attach pad.

16 Claims, 5 Drawing Sheets

Step 8: Singulation or Saw Punching

Step 1: Raw Material (Cu Panel)

Step 2: Etch Resist Coating

Step 3: UV Exposure With Phototool

Step 4: Developing

Step 5: Immersion Etching and Stripping

Step 6: Plating with Ag or Ni/Pd

Step 7: Die Attach, Wire Bonding and Molding

Step 8: Singulation or Saw Punching

Step 1: Raw Material (Cu Panel)

Step 2: Etch Resist Coating

Step 3: UV Exposure With Phototool

Step 4: Developing

Step 5: Immersion Etching and Stripping

Step 6: Plating with Ag or Ni/Pd

Step 7: Die Attach, Wire Bonding and Molding

Step 8: Singulation or Saw Punching

LEADLESS PLASTIC CHIP CARRIER WITH PARTIAL ETCH DIE ATTACH PAD

CROSS-REFERENCE TO RELATED APPLICATION

This is a continuation-in-part of U.S. patent application Ser. No. 09/454,794, filed Dec. 3, 1999, now U.S. Pat. No. 6,294,100, which is a continuation-in-part of U.S. patent application Ser. No. 09/288,352, filed Apr. 8, 1999 now U.S. Pat. No. 6,498,099, which is a continuation-in-part of U.S. patent application Ser. No. 09/095,803, now U.S. Pat. No. 6,229,200, filed Jun. 10, 1998 and issued May 8, 2001.

FIELD OF THE INVENTION

The present invention relates in general to integrated circuit packaging, and more specifically to an improved leadless plastic chip carrier which includes a unique die attach pad feature.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior an methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saws-singulated using a conventional wafer saw. The singulation is guided by a pattern of fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicants' co-pending U.S. patent application Ser. No. 09/288,352, the contents of which are incorporated herein by reference, a localized etch process is provided for the improved manufacture of the LPCC IC package. The leadframe strip is subjected to a partial etch on one or both of the top and bottom surfaces in order to create a pattern of contact leads (pads) and a die attach pad (paddle).

Although these prior art processes yield IC package designs with improved electrical performance over the prior art, it is desirable to further increase package density and thereby reduce the length of the gold wire bonds.

Accordingly, it is an object of the present invention to provide an improved leadless plastic chip carrier which includes a post mold etch back step and a unique die attach pad feature.

SUMMARY OF THE INVENTION

According to an aspect of the present invention, a new leadless plastic chip carrier is provided. The leadless plastic chip carrier has a die attach pad, a semiconductor die mounted to a portion of the die attach pad and at least one row of contact pads circumscribing the die attach pad. The contact pads have a thickness greater than the thickness of the portion of the die attach pad. A plurality of wire bonds connect the die attach pad and the contact pads and an overmold covers the semiconductor die and all except one surface of the contact pads and the die attach pad.

According to another aspect of the present invention, a new process for fabricating a leadless plastic chip carrier is provided. The process has the steps of: depositing a photo-imageable etch resist on opposing first and second surfaces of a leadframe strip; imaging and developing the etch resist to define a pattern for a die attach pad and at least one row of contact pads; etching the leadframe strip to define the contact pads and the die attach pad such that at least a portion of the die attach pad has a thickness less than the thickness of the contact pads; mounting the semiconductor die to the portion of the die attach pad; wire bonding the semiconductor die to the contact pads; and encapsulating the first surface of the leadframe strip in a molding material.

It is an advantage of an aspect of the present invention that the semiconductor die sits in a portion of the die attach pad that is reduced in thickness and therefore the length of the wire bonds (both to the die attach pad (ground bonds) and to the external pads (I/O bonds) can be reduced. Because electrical impedance in an IC package is directly related to the wire length, this construction allows for a LPCC package suitable to operate an higher frequencies compared to the prior art packages.

A further advantage of an aspect of the present invention is provided by the three dimensional nature of the partial etch die attach pad. This pad provides additional exposed metal for the mold compound to adhere to, thereby providing a more robust package.

Still further, it is an advantage of an aspect of the present invention that the die and wire bonds are lower in the profile of the package. This allows the option of using a thinner mold cap to further reduce the package profile.

BRIEF DESCRIPTION OF THE DRAWINGS

The invention will be better understood with reference to the drawings in which.

DETAILED DESCRIPTION OF THE PREFERRED EMBODIMENT

Figure 1A:
FIGS. 1A–1H show processing steps for manufacturing a Leadless Plastic Chip Carrier (LPCC) with a unique die attach pad feature according to an embodiment of the present invention.

The present invention relates to an improvement over Applicant's U.S. Pat. No. 6,229,200 for a Saw Singulated Leadless Plastic Chip Carrier (LPCC). Where possible, the same reference numerals have been used in this application to denote identical features described in Applicant's above-noted LPCC patent.

Referring to FIG. 1A, an elevation view is provided of a Cu (copper) panel substrate which forms the raw material of the leadframe strip indicated generally by the numeral 100. As discussed in greater detail in Applicants' U.S. Pat. No. 6,229,200, the leadframe strip 100 is divided into a plurality of sections, each of which incorporates a plurality of leadframe units in an array (e.g 3×3 array, 5×5 array, etc.). Only one such unit is depicted in the elevation view of FIG. 1A, portions of adjacent units being shown by stippled lines.

Figure 1B:
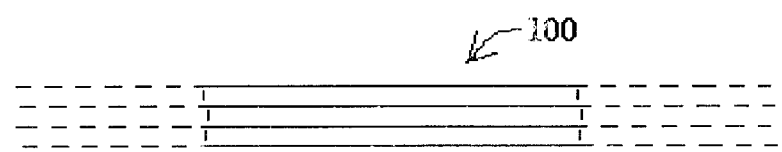

Referring to FIG. 1B, an upper and a lower surface of the leadframe strip 100 is coated with a layer of photo-imageable etch resist such as a photo-imageable epoxy. The photo resist is spin coated on the leadframe strip, exposed with light and the exposed portions are selectively removed.

Figure 1C:
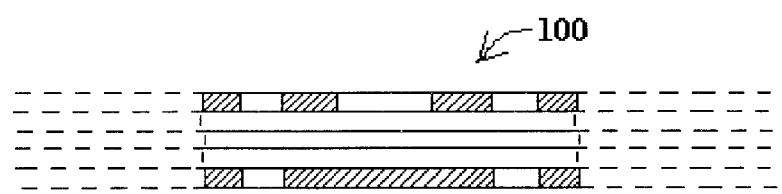
Figure 1D:
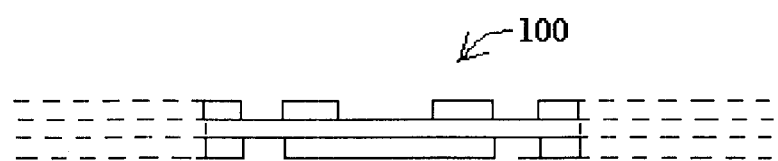

Next, the layer of photo-imageable etch resist is imaged with a photo-tool. This is accomplished by exposure of the etch resist to ultraviolet light masked by the photo-tool, as shown in FIG. 1C, and subsequent developing of the etch resist, as shown in FIG. 1D. The etch resist is thereby patterned to provide pits on both the upper and the lower surfaces of the leadframe strip, in which the Cu substrate is exposed.

Figure 1E:
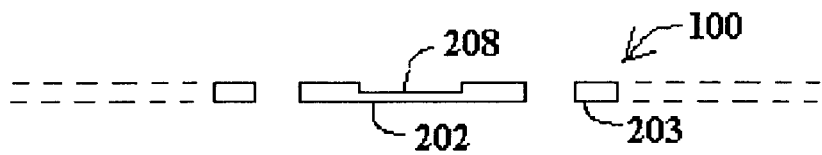

The leadframe strip 100 is then immersion etched in order to etch both the top and bottom surfaces and, following which, the etch resist is stripped away using conventional means. The resulting pattern of contact pads 203 and die attach pad 202 is shown in FIG. 1E.

The die attach pad 202 is patterned with a pit 208 at a portion of the upper surface. The pit 208 is a portion of the die attach pad 202 at which the thickness of the pad 202 is less than the thickness in the remainder of the die attach pad 202 and the contact pads 203. This pit 208 results from the pattern of developed etch resist and subsequent etching as shown in FIGS. 1D and 1E, respectively. Note that at the pit 208 portion of the die attach pad 202, only the top surface of the leadframe strip is exposed to the etchant upon immersion as the bottom surface of the leadframe strip is masked by the etch resist at the pit 208 portion of the die attach pad 202.

Figure 1F:
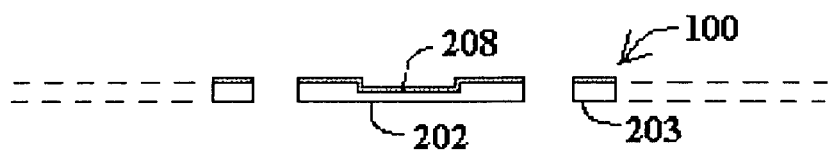

Next, the leadframe strip 100 is plated with silver (Ag) or nickel/palladium (Ni/Pd) to facilitate wire bonding (FIG. 1F).

Figure 1G:
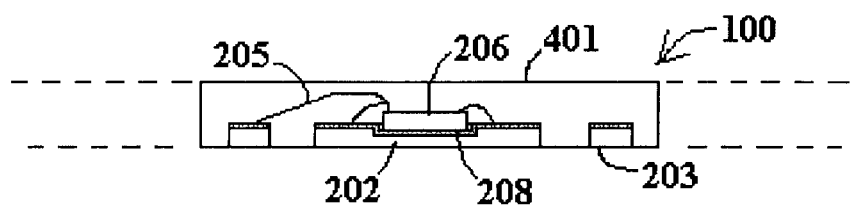

A singulated semiconductor die 206 is conventionally mounted via epoxy (or other means) in the pit 208 of the die attach pad 202, and the epoxy is cured. Gold wires 205 are then bonded between the semiconductor die 206 and peripheral leads or contact pads 203. The leadframe is then molded using a modified mold with the bottom cavity being a flat plate, and subsequently cured, as discussed in Applicants' U.S. Pat. No. 6,229,200. The above discussed adhesion promoter aids adhesion between the leadframe strip and the molding material. The leadframe 100, after the foregoing steps, is shown in FIG. 1G, which includes overmold 401 of cured plastic or epoxy (0.8 mm).

Figure 1H:
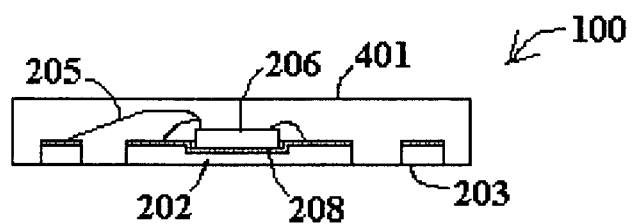
Figure 2A:
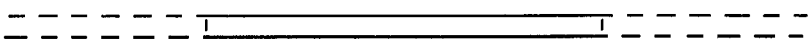
FIGS. 2A–2H show processing steps for manufacturing a LPCC with a unique die attach pad feature according to another embodiment of the present invention.
Figure 2B:
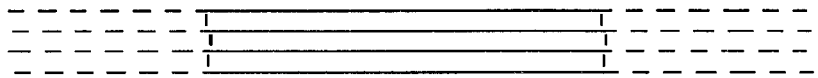
Figure 2C:
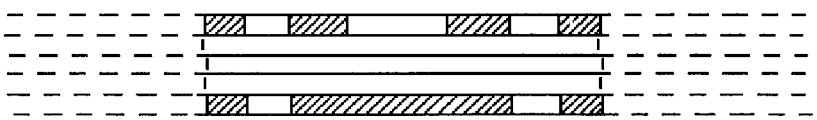
Figure 2D:
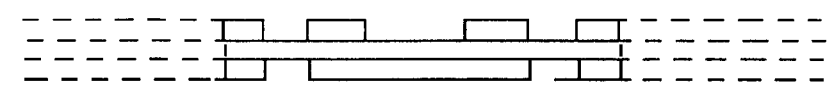
Figure 2E:
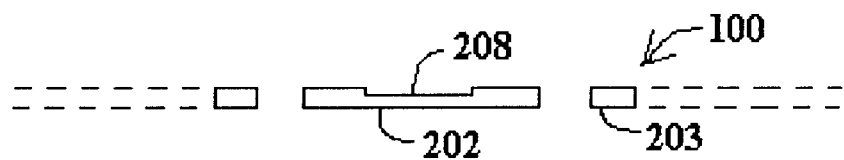
Figure 2F:
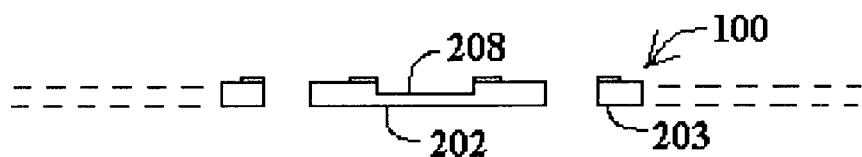
Figure 2G:
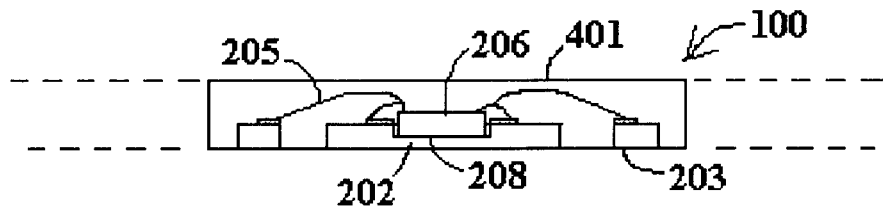
Figure 2H:
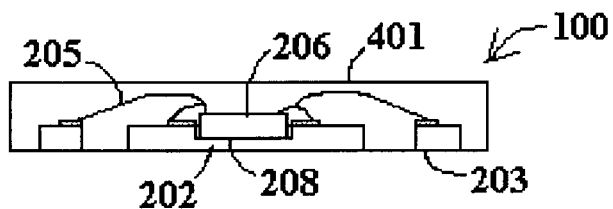

Singulation of the individual units from the full leadframe array strip 100 is then performed either by saw singulation or die punching resulting in the final configuration of FIG. 1H. Thus, the die attach pad and contact pads 203 are isolated.

Referring now to FIGS. 2A–2I, there is provided processing steps for manufacturing a LPCC with a post mold etch back step and a unique die attach pad feature according to another embodiment of the present invention. Steps 1 to 5 of FIGS. 2A to 2E are substantially identical to steps 1 to 5 of FIGS. 1A to 1E of the first embodiment, as described above, and will not be further described herein.

At step 6 (FIG. 2F), only an upper surface portion of the die attach pad 202 and an upper surface portion of the contact pads 203 are plated with silver (Ag) to facilitate wire bonding.

Steps 7 to 9 (FIGS. 2G to 2H) of the present embodiment are substantially identical to steps 7 to 9 (FIGS. 1G to 1H) of the first embodiment.

Figure 3:
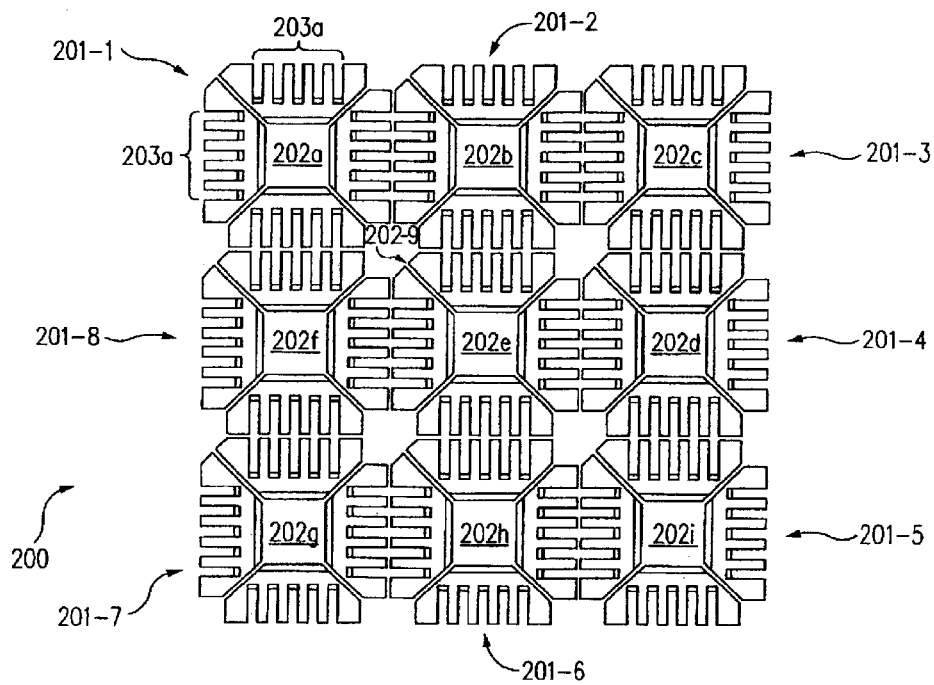
FIG. 3 shows a 3×3 array of leadframes which can be formed in any section of a leadframe strip.

FIG. 3 shows a 3×3 array of lead frames 200 which call be formed in any of the sections of leadframe strip 100. The 3×3 array 200 includes leadframes 201-1 to 201-9.

Figure 4:
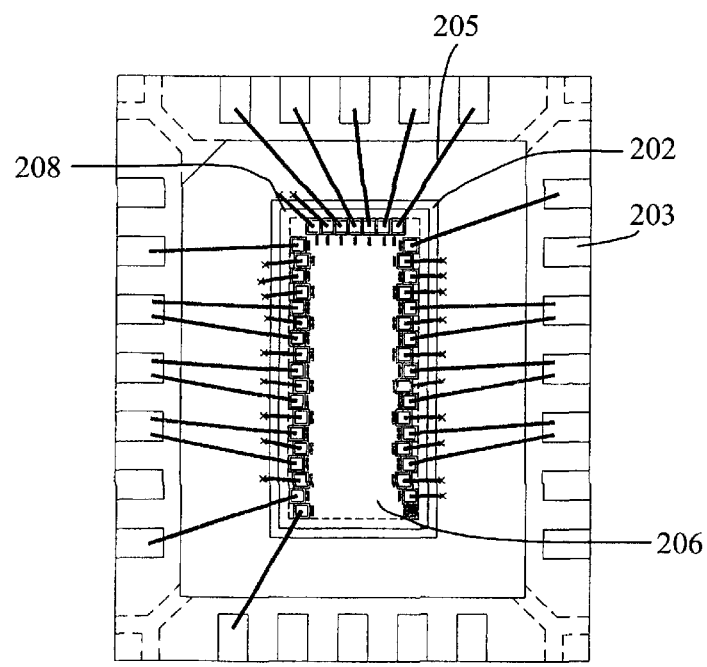
FIG. 4 is a top view of a single leadframe manufactured in accordance with an embodiment of the present invention.

FIG. 4 shows a top view of a single leadframe manufactured in accordance with the present embodiment of the invention.

Variations and modifications of the preferred embodiment are possible. For example, Nickel/palladium (Ni/Pd) can be used to facilitate wire bonding rather than Ag. All such modifications are believed to be within the scope of the present invention as set forth in the claims appended hereto.

We claim:

1. A leadless plastic chip carrier comprising:
    a die attach pad;
    a semiconductor die mounted to a portion of said die attach pad;
    at least one row of contact pads circumscribing said die attach pad, said at least one row of contact pads having a thickness greater than the thickness of said portion of said die attach pad;
    a plurality of wire bonds connecting said semiconductor die and said contact pads, and
    an overmold covering said semiconductor die and all except one surface of said at least one row of contact pads and said die attach pad.

2. The leadless plastic chip carrier according to claim 1 wherein said portion of said die attach pad has thickness that is less than a remainder of said die attach pad.

3. The leadless plastic chip carrier according to claim 1 wherein said die attach pad and said contact pads comprise Cu.

4. The leadless plastic chip carrier according to claim 1 wherein at least a portion of said remainder of said die attach pad includes a layer of metal plated on a surface thereof.

5. The leadless plastic chip carrier according to claim 4 wherein said metal is Ag.

6. The leadless plastic chip carrier according to claim 1 wherein at least a portion of said contact pads and at least a portion of said remainder of said die attach pad include a layer of metal on a surface thereof.

7. The leadless plastic chip carrier according to claim 6 wherein said metal is Ag.

8. The leadless plastic chip carrier according to claim 6 wherein said metal is Ni/Pd.

9. A process for fabricating a leadless plastic chip carrier, comprising the steps of:

depositing a photo-imageable etch resist on opposing first and second surfaces of a leadframe strip;

imaging and developing said etch resist to define a pattern for a die attach pad and at least one row of contact pads;

etching said leadframe strip to define said die attach pad and a plurality of said contact pads, such that a portion of said die attach pad has a thickness less than the thickness of said contact pads;

mounting said semiconductor die to said portion of said die attach pad;

wire bonding said semiconductor die to said contact pads; and encapsulating said first surface of said leadframe strip in a molding material.

10. The process for fabricating a leadless plastic chip carrier according to claim 9 wherein said step of etching said leadframe comprises immersion etching.

11. The process for fabricating a leadless plastic chip carrier according to claim 10 further comprising the step of saw singulation to separate the leadless plastic chip carrier from said leadframe strip.

12. The process for fabricating a leadless plastic chip carrier according to claim 11 further comprising the step of plating a layer of metal on a second portion of said die attach pad.

13. The process for fabricating a leadless plastic chip carrier according to claim 12 wherein said metal comprises Ag.

14. The process for fabricating a leadless plastic chip carrier according to claim 11 further comprising the step of plating a surface of said strip with a suitable metal for facilitating wire bonding, prior to the step of mounting said semiconductor.

15. The process for fabricating a leadless plastic chip carrier according to claim 14 wherein the metal comprises Ag.

16. The process for fabricating a leadless plastic chip carrier according to claim 14 wherein the metal comprises Ni/Pd.

* * * * *